United States Patent [19]

Jung et al.

[11] Patent Number: 5,241,227

[45] Date of Patent: Aug. 31, 1993

[54] ACTIVE HIGH BAND WEIGHTING CIRCUIT OF NOISE REDUCTION CIRCUIT

[75] Inventors: Duck-young Jung, Incheon; Seung-yup Koo, Seoul, both of Rep. of Korea

[73] Assignee: Samsung Electronics Co., Ltd., Kyunggi, Rep. of Korea

[21] Appl. No.: 820,774

[22] Filed: Jan. 15, 1992

[30] Foreign Application Priority Data

Jun. 14, 1991 [KR] Rep. of Korea .................. 91-9840

[51] Int. Cl.⁵ ............................................. G05F 3/26
[52] U.S. Cl. ................................... 307/520; 323/312; 323/315; 323/316; 381/94
[58] Field of Search ............. 307/520; 323/312, 315, 323/316; 381/94

[56] References Cited

U.S. PATENT DOCUMENTS

| | | | |
|---|---|---|---|
| 4,507,600 | 3/1985 | Okayama | 323/312 |
| 4,804,904 | 2/1989 | Katakura | 307/520 |
| 5,061,862 | 10/1991 | Tamagawa | 323/316 |
| 5,105,145 | 4/1992 | Neth | 323/316 |

Primary Examiner—William L. Sikes
Assistant Examiner—Scott A. Ouellette
Attorney, Agent, or Firm—Rothwell, Figg, Ernst & Kurz

[57] ABSTRACT

A high band weighting circuit of a noise reduction circuit is disclosed. For elevating a mid and high frequency component gain comparing with a low frequency component among input signal, the high band weighting circuit comprises a capacitor a dividing means a first voltage-to-current converting circuit, a second voltage-to-current converting circuit, a first current mirror circuit outputting a third current signal corresponding to a first current signal of the first voltage-to-current converting circuit, a second current mirror circuit coupling a fourth current signal to the output terminal corresponding to a second current signal of the second voltage-to-current converting circuit, and a third current mirror circuit coupling a fifth current signal to the output terminal corresponding to a third current signal of the first current mirror circuit. Accordingly, the high band weighting circuit can simplify circuit construction and reduce mismatching by coupling outputs of the voltage-to-current converting circuits to output terminal through current mirror circuit.

3 Claims, 4 Drawing Sheets

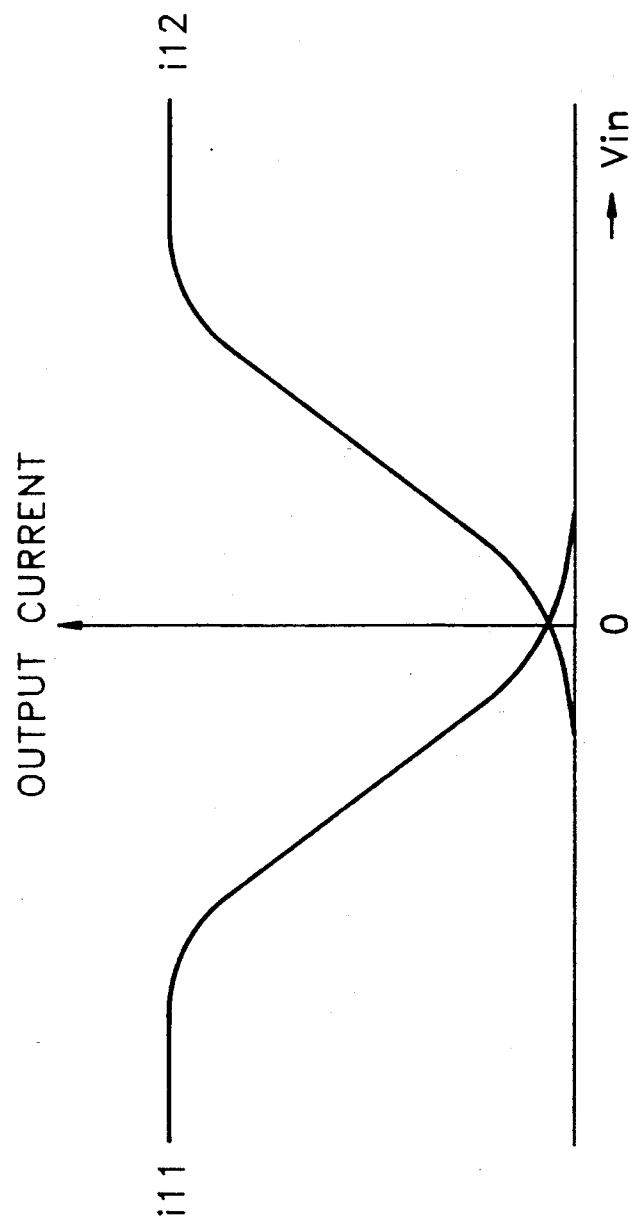

ACTIVE HIGH BAND WEIGHTING CIRCUIT OF NOISE REDUCTION CIRCUIT

BACKGROUND OF THE INVENTION

The present invention relates to a noise reduction circuit and more particularly to an active high band weighting circuit.

To construct an active filter on an integrated circuit, a voltage to current converter is an important element.

A block diagram of a conventional noise reduction circuit disclosed in U.S. Pat. No. 4,804,904 is shown in FIG. 1. An input signal from the input terminal 100 is supplied to a variable high-pass filter 200 and an adder 300. The output of the adder 300 is taken out from an output terminal 400. In the variable high-pass filter 200, its cut-off frequency varies by control voltage from a level detector 500 and the cut-off frequency increases with the increase of a signal level. The output of the variable high-pass filter 200 is supplied to the adder 300 and a high band weighting circuit 600. The output of high band weighting circuit 600 is given to the level detector 500.

In the absence of a signal, the cut-off frequency of the variable high-pass filter 200 is in the lowest state. By the adder 300, the input signal and the signal passing the variable high-pass filter 200 are added so that the gains in the middle and high frequency regions are raised by approximately 10 dB. On the other hand, the middle and high frequency regions elevated at the time of recording is attenuated by about 10 dB in a decoding circuit on the reproduction side. As a result, noises in the middle and high frequency regions are attenuated by approximately 10 dB. With the increase of the signal level, the cut-off frequency of the variable high-pass filter 200 is raised and the frequency characteristic of the circuit approaches a flat state. Since the decoding circuit on the reproduction side approaches a flat state, a noise reduction effect decreases. However, in this state, no noise is sensed because a masking effect by the signal works.

The high band weighting circuit 600 is a filtering circuit and acts to increase the cut-off frequency of the variable high-pass filter 200 when an input frequency increases.

The detailed circuit configuration of the high band weighting circuit 600 in the above described noise reduction circuit will be explained with reference to FIG. 2. In FIG. 2, when an input signal Vin is supplied to the bases of the transistors 1 and 7 and when the bases of the transistor 2 and 6 are kept at zero potential, the V-I converting circuit 51 operates with the input signal Vin of a negative level so that a V-I conversion output current is produced by the current of the transistor 1. By the input signal Vin of a positive level, the V-I converting circuit 52 operates so that a V-I conversion output current is produced by the current of the transistor 6.

As the input signal Vin increases, the current i1 decreases. When the input signal Vin becomes almost 0V, the current of the transistor 1 assumes 0. When the input signal Vin is higher than 0V, the current of the transistor 6 increases.

In this way, by the use of the two V-I converting circuits 51 and 52, the V-I converting circuit 51 operates when the input signal Vin is negative, while the V-I converting circuit 52 operates when the input signal Vin is positive. As a result, no offset voltage Voff appears at the output terminal 17 even if there is offset voltage Vo due to mismatching etc. in respective saturation currents of the diode pairs of the diodes 18, 19 and the diodes 20, 21 and the transistor pairs of the transistors 22, 23 and the transistors 24, 25. This is because the multipliers 53 and 54 are almost cut off in the absence of a signal.

Since multipliers 53 and 54 couples to between the voltage to current converting circuits 51 and 52 and the output stage in the absence of a signal for excluding the effect of offset voltage Voff, there are disadvantages to complicate the circuit construction and to increase the chip size on constructing on an integrated circuit.

SUMMARY OF THE INVENTION

It is an object of the present invention to provide an active high band weighting circuit of a noise reduction circuit which can minimize chip size and simplify circuit construction.

To achieve the above object, in a high band weighting circuit for elevating gain of mid and high frequency components comparing with that of low frequency components the active high band weighting circuit of a noise reduction circuit according to the present invention comprises:

a capacitor for connecting an input signal of the mid and high frequency to an output terminal components;

a dividing means for dividing an input voltage signal of the low frequency into a prescribed level components;

a first voltage to current conversion circuit outputting a first current signal when an input signal divided by the dividing means is a positive signal;

a second voltage to current conversion circuit outputting a second current signal when the input signal divided by the dividing means is a negative signal;

a first current mirror circuit outputting a third current signal corresponding to the first current signal of the first voltage to current conversion circuit;

a second current mirror circuit for connecting a fourth current signal to the output terminal corresponding to the second current signal of the second voltage-to-current conversion circuit; and a third current mirror circuit as an active load for connecting a fifth current signal to the output terminal corresponding to said third current signal of the first current mirror circuit.

BRIEF DESCRIPTION OF THE DRAWINGS

The above object of the present invention will become more apparent by describing the preferred embodiments of the present invention with reference to the attached drawings, in which:

FIG. 4 shows a voltage to current graph of the voltage to current converter according to the present invention.

DETAILED DESCRIPTION OF THE INVENTION

Figure 1:
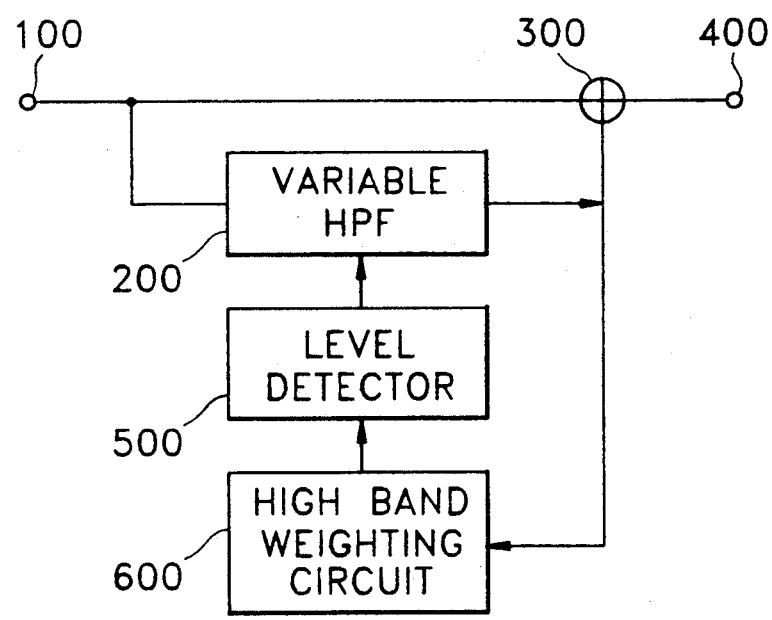
FIG. 1 shows a block diagram of a conventional noise reduction circuit.
Figure 2:
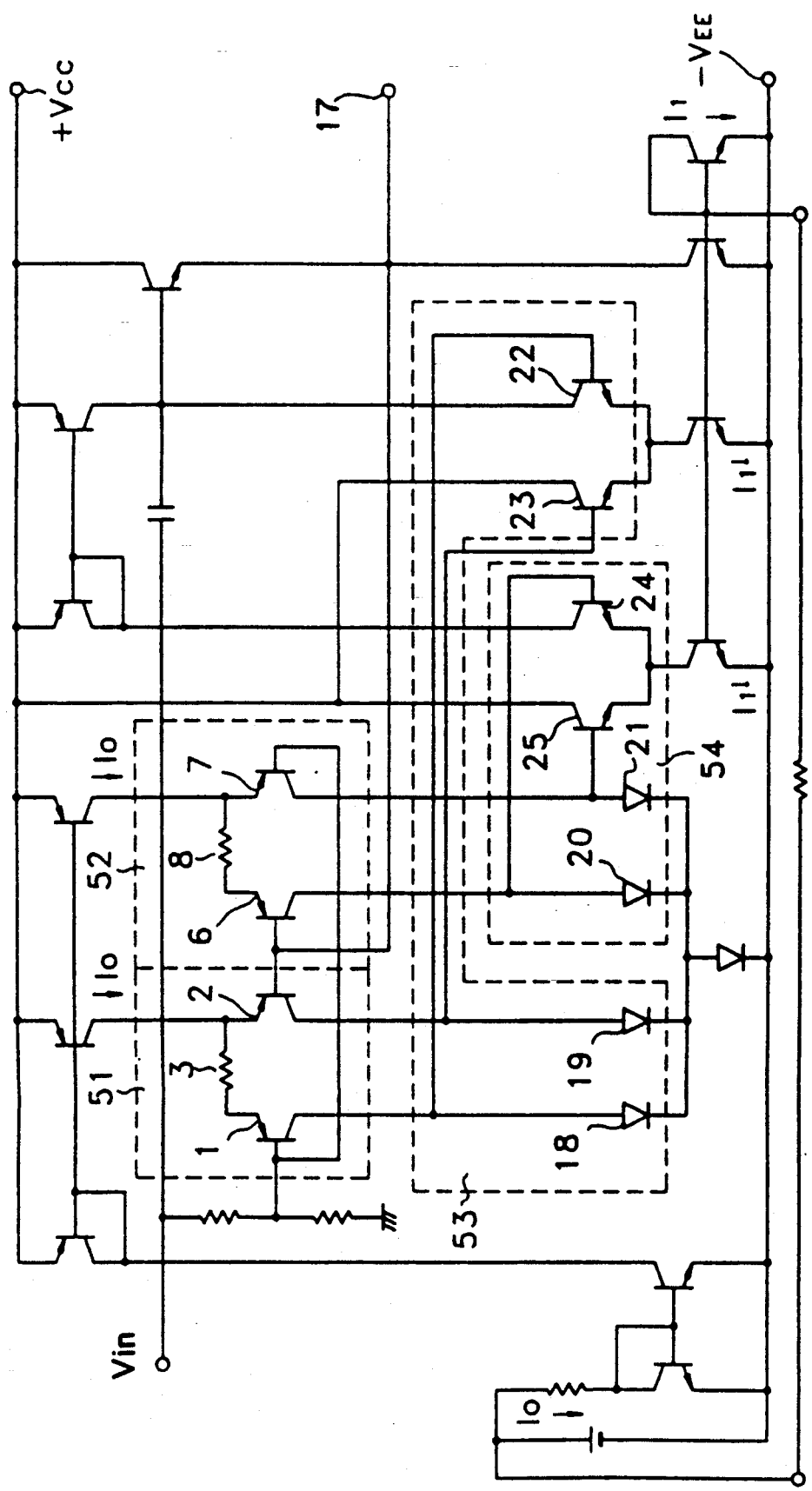
FIG. 2 shows a conventional active high band weighting circuit.
Figure 3:
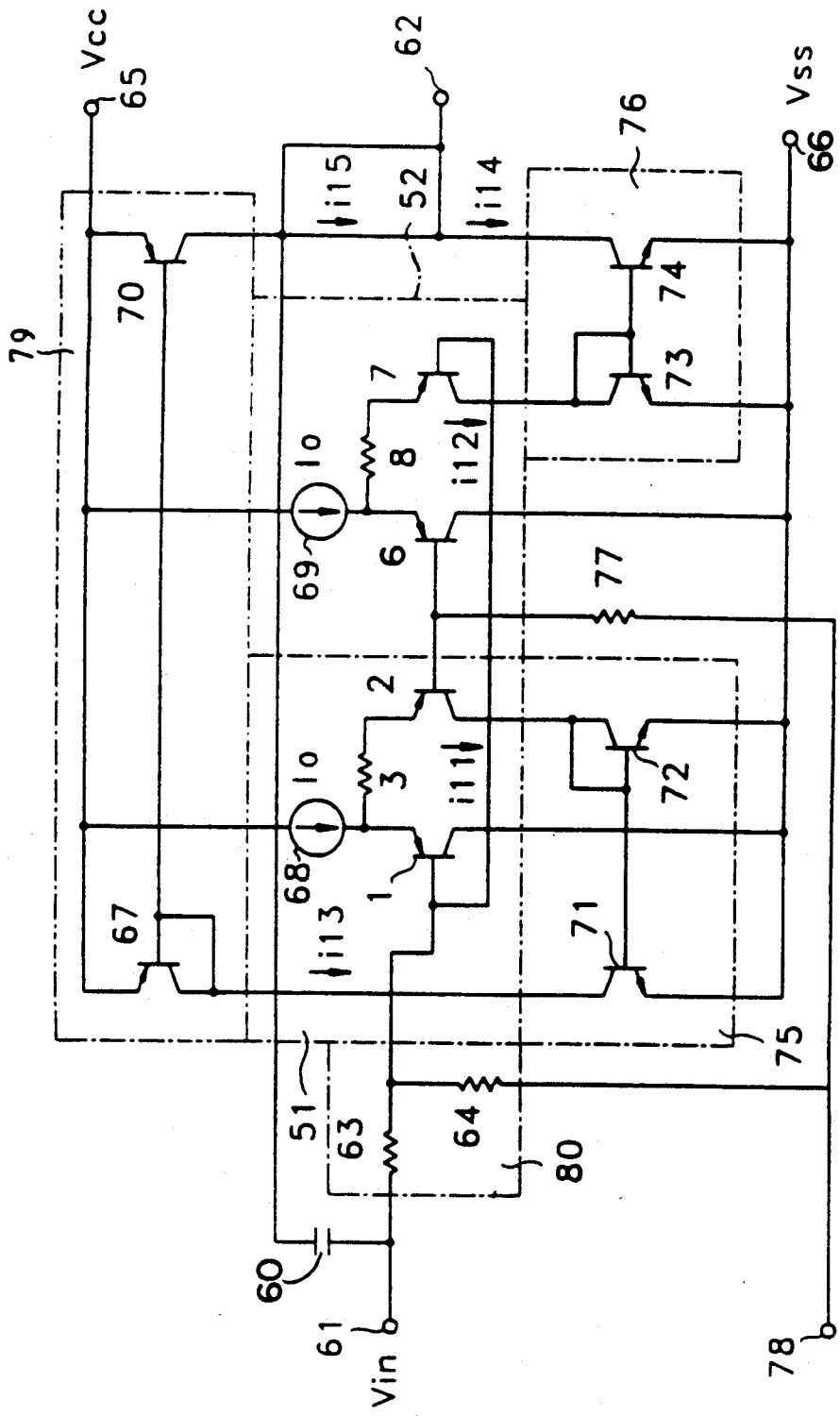
FIG. 3 shows an active high band weighting circuit according to the present invention.

FIG. 3 shows an embodiment of the active high band weighting circuit of the noise reduction circuit according to the present invention. The circuit construction is as follows.

In FIG. 3, the active high band weighting circuit of the noise reduction circuit according to the present invention includes a first and second voltage to current converting circuits 51 and 52, a first, second, and third current mirror circuits 75, 76, 79. The condenser 60 is connected to an input terminal 61. The input terminal 61 is connected to one end of a resistance 63 of the dividing means 80.

The other end of the resistance 63 is connected to one end of a resistance 64 and the other end of the resistance 64 is connected to reference voltage source(not shown), i.e., reference voltage terminal 78 providing reference voltage such as ground level. The common node connecting the other end of the resistance 63 and one end of the resistance 64 and bases of transistors 1 and 7 of the first and second voltage to current converting circuit 51 and 52 are commonly connected and bases of transistors 2 and 6 are commonly connected to the reference voltage terminal 78 through the resistance 77. Collectors of transistors 1 and 6 are connected to a second power supply terminal 66 providing a second power supply voltage Vss. The emitter of the transistor 1 is connected to the emitter of the transistor 2 through a resistance 3 and also a first power supply terminal 65 providing a first power supply voltage Vcc through a first constant current source 68. The emitter of the transistor 6 is connected to the emitter of the transistor 7 through a resistance 8 and also the first power supply terminal 65 through a second constant current source 69. Bases of transistors 67 and 70 of a third current mirror circuit 79 are commonly connected and emitters of transistors 67 and 70 are commonly connected to the first power supply terminal 65. And the base of the transistor 67 is connected to its collector to form a third current mirror circuit 79, the collector of the transistor 70 is connected to the output terminal 62. Emitters of transistors 71, 72, 73, 74 are connected to the second power supply terminal 66.

Bases of transistors 71 and 72 are commonly connected to each other and collectors of transistors 67 and 71 and collectors of transistors 2 and 72 are respectively connected to each other. Collector of transistor 72 is connected to its base to form a current-mirror circuit 75.

Bases of transistors 73 and 74 are commonly connected to each other and collectors of transistors 7 and 73 and collectors of transistors 70 and 74 are respectively connected to each other. Collector of transistor 73 is connected to its base to form a current-mirror circuit 76.

The operation of the present invention on the basis of the above construction will be given as follows.

When the input signal Vin is applied to bases of transistors 1 and 7 voltage to current converting circuits 51 and 52 produces current proportional to input voltage level to collector of transistor 2 in the case of the base voltage of the transistor 1 is higher than that of the transistor 2 and produces current proportional to input voltage level to collector of transistor 7 in the case of the base voltage of the transistor 7 is higher than that of the transistor 6. The outputs of voltage to current converting circuits 51 and 52 become reference currents of current mirror circuits 75 and 76 consisting of transistors 72 and 73 and the current ratio of the current mirror circuit decides current of transistor 71 by transconductance Gm consisting of the sum of the resistance re of transistor 2 and the resistance 3 and current of transistor 74 by transconductance Gm consisting of the sum of the resistance re of transistor 7 and the resistance 8. That is, if the resistance of transistor 72 is n, then the current of transistor 71 becomes 1/n. Also, if the resistance of transistor 73 is n, then the current of transistor 74 becomes 1/n.

Consequently, if a current flows in transistor 2 of a first stage of voltage-to-current converting circuit 51, $B^1/n$ of the current flows in collector of transistor 71 and the output terminal 62 becomes positive level since the current doesn't flow in collector of transistor 7. On the other hand, if n times current flows in collector of transistor 73, the output terminal 62 becomes a negative level since 1/n current flows in collector of transistor 74.

As the same result, when the input signal is positive, a first current signal i11 outputted from a first voltage-to-current converting circuit 51 is applied to a first current mirror circuit 75 as reference current, so that a third current signal i13 flows in collector of transistor 71 proportional to the size ratio of transistor 71, 72 and a third current signal i13 is applied to a third current mirror converting circuit 79 as a reference current, so that the fifth current signal i15 becomes output signal corresponding to divided voltage of positive input signal. On the other hand, when the input signal is negative, a second current signal outputted from a second voltage-to-current converting circuit 52 is applied to the second current mirror circuit 76 as reference current, so that a fourth current signal i14 proportional to the size ratio of transistors 73 and 74 flows in collector of transistor 74. The fourth current signal i14 becomes output signal corresponding to divided voltage of negative input signal.

FIG. 4 shows a relationship between the input signal Vin and the current i11 flowing the transistor 2 and the current i12 flowing the transistor 7.

Accordingly, when an absence of signal, an offset voltage Voff by mismatching doesn't show up to the output terminal 62 since the first and second current mirror circuit 75 and 76 are cut off state.

Also, there are advantages to simplify circuit construction and reduce mismatching because only current output referred to input signal among a pair of current outputs of a first and second voltage-to-current converting circuit 51 and 52 is coupled to the output terminal 62 through the current mirror circuit.

What is claimed is:

1. In a high band weight circuit for elevating a mid and high frequency component gain comparing with a low frequency component among input signal, the high band weighting circuit comprising;

a capacitor for connecting an input signal of said mid and high frequency component to an output terminal;

a dividing means for dividing said input signal of said low frequency component into a prescribed voltage level;

a first voltage-to-current converting circuit outputting a first current signal when the voltage divided input signal by said dividing means is a positive signal;

a second voltage-to-current converting circuit outputting a second current signal when the voltage divided input signal by said diving means is a negative signal;

a first current mirror circuit outputting a third current signal corresponding to said first current signal of said first voltage-to-current converting circuit;

a second current mirror circuit coupling a fourth current signal to said output terminal corresponding to said second current signal of said second voltage-to-current converting circuit; and a third current mirror circuit coupling a fifth current signal to said output terminal corresponding to said third current signal of said first current mirror circuit.

2. A high band weighting circuit as claimed in claim 1, wherein said dividing means is serially connected to a common connecting node between an input terminal receiving said input signal and a voltage terminal connected as a reference voltage source and provides a terminal voltage of resistance connected between said voltage terminal and said common connecting node as a divided input signal.

3. A high band weighting circuit as claimed in claim 2, wherein said first voltage-to-current converting circuit comprises:

a first constant current source connected between a first power supply terminal and a first node; a first transistor having an emitter connected to said first constant current source and a collector to a second power supply terminal and said divided input signal to a base; and a second transistor having an emitter connected to said first constant current source through a first resistance, a base connected to said voltage terminal through a second resistance and a collector outputting said first current signal, and said second voltage-to-current converting circuit comprises:

a second constant current source connected between said first power supply terminal and a second node; a third transistor having an emitter connected to said first constant current source and a collector to said second power supply terminal and a base connected to said voltage terminal through said second resistance; and a fourth transistor having an emitter connected to said second constant current source through a third resistance and a base connected to said divided input signal and a collector outputting said second current signal.

* * * * *

UNITED STATES PATENT AND TRADEMARK OFFICE
CERTIFICATE OF CORRECTION

PATENT NO. : 5,241,227

DATED : August 31, 1993

INVENTOR(S) : D. Jung et al

It is certified that error appears in the above-indentified patent and that said Letters Patent is hereby corrected as shown below:

Col. 4, line 10, "B1/n" should be --1/n--.

Signed and Sealed this

Fifth Day of April, 1994

Attest:

BRUCE LEHMAN

Attesting Officer     Commissioner of Patents and Trademarks